United States Patent
Sachan et al.

(12)

(10) Patent No.: US 6,693,035 B1
(45) Date of Patent: Feb. 17, 2004

(54) METHODS TO CONTROL FILM REMOVAL RATES FOR IMPROVED POLISHING IN METAL CMP

(75) Inventors: Vikas Sachan, Hockessin, DE (US); Peter A. Burke, Avondale, PA (US); Elizabeth A. (Kegerise) Langlois, Newark, DE (US); Keith G. Pierce, Colorado Springs, CO (US)

(73) Assignee: Rodel Holdings, Inc., Wilmington, DE (US)

( * ) Notice: Subject to any disclaimer, the term of this patent is extended or adjusted under 35 U.S.C. 154(b) by 0 days.

(21) Appl. No.: 09/420,682

(22) Filed: Oct. 19, 1999

Related U.S. Application Data

(60) Provisional application No. 60/104,876, filed on Oct. 20, 1998.

(51) Int. Cl.[7] .............................................. H01L 21/302
(52) U.S. Cl. ....................... 438/692; 438/693; 252/79.1
(58) Field of Search .................................. 438/690, 692, 438/691, 689

(56) References Cited

U.S. PATENT DOCUMENTS

| | | | |
|---|---|---|---|
| 4,462,188 A | | 7/1984 | Payne |
| 5,139,571 A | * | 8/1992 | Deal et al. ...................... 106/3 |
| 5,614,444 A | | 3/1997 | Farkas et al. ................ 437/225 |
| 5,676,587 A | * | 10/1997 | Landers et al. ............... 451/37 |
| 5,773,364 A | | 6/1998 | Farkas et al. ................ 438/692 |
| 5,783,489 A | * | 7/1998 | Kaufman et al. ............... 106/3 |
| 5,861,076 A | * | 1/1999 | Adlam et al. ................. 148/272 |
| 5,934,980 A | * | 8/1999 | Koos et al. ..................... 451/41 |
| 6,001,730 A | * | 12/1999 | Farkas et al. ................ 438/627 |
| 6,046,110 A | * | 4/2000 | Hirabayashi et al. ......... 216/88 |
| 6,063,306 A | * | 5/2000 | Kaufman et al. ............. 216/89 |
| 6,068,787 A | * | 5/2000 | Grumbine et al. ......... 252/79.1 |
| 6,077,337 A | * | 6/2000 | Lee ............................... 106/3 |
| 6,120,354 A | * | 9/2000 | Koos et al. ..................... 451/41 |
| 6,130,163 A | * | 10/2000 | Yi et al. ....................... 438/692 |
| 6,136,711 A | * | 10/2000 | Grumbine et al. .......... 438/692 |
| 6,147,002 A | * | 11/2000 | Kneer .......................... 438/692 |

* cited by examiner

*Primary Examiner*—Kin-Chan Chen
(74) *Attorney, Agent, or Firm*—Kenneth A. Benson; Blake T. Biederman

(57) ABSTRACT

A method for chemical mechanical planarization of a semiconductor structure comprised of a conductive metal interconnect layer, a barrier or liner film, and an underlying dielectric layer using a two-step polishing process is provided. In the first step, the conducting metal overburden is substantially removed with little removal of the barrier or liner layer or the underlying dielectric structure. In the second step, the barrier layer is removed with little removal of the underlying dielectric layer. Five different methods and associated slurry compositions are described for the second polishing step, each adjusted to the state of the wafer following the first step of polishing. By using the appropriate method, the integrity of the remaining semiconductor structure can be substantially retained.

3 Claims, No Drawings

METHODS TO CONTROL FILM REMOVAL RATES FOR IMPROVED POLISHING IN METAL CMP

This application claims the benefit of provisional application Ser. No. 60/104,876 filed Oct. 20, 1998.

BACKGROUND OF THE INVENTION

1. Field of the Invention

The invention described pertains to the polishing methods and slurry formulations used in the planarization of integrated circuit surfaces containing various films, most particularly those of a metal, a barrier or liner layer, and a dielectric layer.

2. Related Art

One of the critical requirements necessary in the production of increasingly complex and dense semiconductor structures is the ability to retain planarity. Without the ability to planarize, the complexity and density of the structures constructed on a semiconductor wafer are greatly limited. Chemical-Mechanical Planarization, or CMP, is an enabling technology in this area, since it has proved to be the most effective method used to planarize surface films on semiconductor substrates.

While the first applications of CMP technology focused on the polishing of dielectric films (i.e., $SiO_2$), polishing of metal structures used for circuit interconnects is increasing rapidly. Along with the increase in metal planarization is a inherent increase in the number of different films that are simultaneously polished. Most metal structures contain three different films: a conductive metal layer, a barrier (or liner) layer between the conductive metal layer and the adjacent dielectric layer, and a dielectric layer. It is often desirable for the removal rates of each film to differ from each other in order to induce planarity and maintain the integrity of the semiconductor structure during polishing. In a typical metal structure, for example, if the entire planarization step were to take place in one step of polishing, it would typically be desirable to have high removal rates of material for the metal and barrier layers, while having low removal rates for the dielectric layer.

However, while it is certainly desirable to limit the number of processing steps, there are often inherent difficulties associated with a one-step process that limit it's usefullness. For example, copper interconnects, coupled with low-k dielectrics, have the potential (when compared to $Al/SiO_2$) to increase chip speed, reduce the number of metal layers required, minimize power dissipation, and reduce manufacturing costs. A typical copper interconnect structure contains a conductive copper film, a barrier layer of tantalum or tantalum nitride, and a dielectric layer of silicon dioxide. In one-step copper CMP, it is desirable to remove the Cu and Ta/TaN barrier layer as fast as possible, while removing the $SiO_2$ dielectric layer as slow as possible. However, this is often difficult, since the regimes in which Cu and Ta exhibit comparable removal rates often do not overlap. Also, it is critical to maintain the underlying semiconductor structure regardless of the removal rates of the various films. For the Cu CMP example, the removal of Cu within the interconnect features (called "dishing" or "recess") is undesirable since optimal electrical performance is obtained when as much of the conducting metal line as possible remains. Also, it is also desirable to minimize the removal of the $SiO_2$ dielectric layer within interconnect structures (called "erosion").

To give satisfactory results in Cu CMP, Landers et al. in U.S. Pat. No. 5,676,587 have proposed a two-step polishing process to be used with Cu interconnect structures. The first step is designed to remove most of the overburden of Cu, and the second step is designed to remove the barrier or liner layer of Ta, TaN, Ti, or TiN. For the second step, a silica based slurry of near-neutral pH is detailed. However, U.S. Pat. No. 5,676,587 does not detail the specific removal rate requirements of the second step slurry. Farkas et al. in U.S. Pat. No. 5,773,364 presents the use of ammonium salts as oxidizers in metal CMP slurries. Farkas et al. in U.S. Pat. No. 5,614,444 discusses the use of materials with a polar and apolar component in silica-based slurries for the suppression of $SiO_2$ removal rate during metal CMP processes. The use of quaternary ammonium salts as an example of a cationic compound is listed.

SUMMARY OF THE INVENTION

A method is provided for polishing a composite semiconductor structure containing a conducting metal interconnect layer, an insulating dielectric layer, and a barrier layer between the two: most preferably, a copper metal layer, a silicon dioxide dielectric layer, and a barrier layer of tantalum. The method involves a two-step polishing process: in the first step, the majority of the conducting metal layer is removed without removing significant amounts of either the barrier layer or the dielectric layer. In the second step, the metal interconnect remaining on the horizontal portions of the barrier layer and the barrier layer are removed without removing significant amounts of the dielectric layer, and without degrading the integrity of the remaining structure by significant removal of the remaining metal layer (commonly called "dishing" or "recess") or removal of significant amounts of the remaining dielectric layer (commonly called "erosion").

Preferred methods of the invention are:

a method for chemical-mechanical polishing of a semiconductor structure comprised of a conductive metal interconnect layer, a barrier or liner film, and an underlying dielectric layer, wherein the method consists of the following steps:
a) removal of the majority of the metal layer using a first-step slurry that has high selectivity between the metal layer and the barrier layer;
b) removal of the barrier layer using a second-step slurry that has a high barrier removal rate, a low metal layer removal rate, a low dielectric layer removal rate and wherein the second-step slurry has a pH which is basic and, a method for chemical-mechanical polishing of a semiconductor structure comprised of a conductive metal interconnect layer, a barrier or liner film, and an underlying dielectric layer, wherein the method consists of the following steps:
a) removal of the majority of said metal layer using a first-step slurry that has high selectivity between said metal layer and said barrier layer;
b) removal of said barrier layer using a second-step slurry that has a high barrier removal rate, a metal layer removal rate between high and low, a low dielectric layer removal rate and wherein said second-step slurry has a pH which is basic.

DESCRIPTION OF THE PREFERRED EMBODIMENTS

An improved method of the CMP polishing of metal interconnect structures. This method is applicable to any metal interconnect structure containing: a conductive metal (such as Cu, Al, or W), a barrier or liner layer (such as Ta, TaN, Ti, or TiN), and an underlying ILD structure (such as $SiO_2$ or a low-K dielectric). In the preferred embodiment, polishing of a structure containing a Cu layer, an underlying Ta barrier layer, and a $SiO_2$ dielectric layer, using a two-step process is described. In the first step, the Cu overburden is removed while removing minimal amounts of the Ta liner or $SiO_2$. The slurry used in the first step of this process is any slurry that can preferentially remove the copper metal overburden covering the semiconductor structure, and has very low rate of material removal on the Ta barrier layer and underlying $SiO_2$ layer. Typically, this slurry would be alumina based, exhibit an acidic pH, and contain oxidizers that would enhance the chemical-mechanical removal of Cu at accelerated rates (above 2000 A/min). An example of a suitable first-step slurry is presented below.

For the second step, five different methods are described, each method depending on the state of the wafer after the first-step of polishing. The five methods discussed for second-step polishing of Cu interconnect structures can be summarized based on the removal rate and selectivity of each film (Table 1 & 2). It should be noted that the slurries maintaining the selectivities in Table 2 but having different removal rates as described in Table 1 would also be suitable and appropriate in this application.

TABLE 1

| Method | Ta RR (A/min) | Cu RR (A/min) | $SiO_2$ RR (A/min) |
|---|---|---|---|
| 1 | >1000 | >1000 | <100 |
| 2 | >1000 | <250 | <100 |
| 3 | >1000 | 250–700 | <100 |
| 4 | >1000 | 250–700 | 250–700 |
| 5 | >1000 | >1000 | >1000 |

TABLE 2

| Method | Ta:Cu | Ta:$SiO_2$ |
|---|---|---|
| 1 | ~1:1 | >5:1 |
| 2 | >4:1 | >5:1 |
| 3 | 1.5:1–4:1 | >5:1 |
| 4 | 1.5:1–4:1 | 1.5:1–4:1 |
| 5 | ~1:1 | ~1:1 |

Method 1—This method utilizes a slurry with significant (>1000 A/min) removal rates of Ta and Cu, and low removal rates of oxide. This method can be used when significant amounts of Cu remain after first step polishing on portions of the wafer. By having high removal rates of both Cu and Ta, any remaining Cu can be removed during removal of the Ta barrier layer. Low removal rates of $SiO_2$ minimizes the amount of oxide erosion.

Method 2—This method utilizes a slurry with significant removal rates of Ta, but low removal rates of Cu and $SiO_2$. This method should be used when very little Cu overburden remains after first-step polishing. This allows for rapid and complete removal of the Ta barrier layer, with little removal of the Cu interconnect structures or the underlying $SiO_2$ dielectric.

Method 3—This method utilizes a slurry with significant removal rates of Ta, somewhat lower removal rates of Cu, and low removal rates of $SiO_2$. This method should be used when some Cu overburden remains, but not as much as was observed under Method 1. This allows for the removal of any Cu remaining on the wafer, complete and rapid removal of the Ta barrier layer, and little removal of the underlying $SiO_2$ layer.

Method 4—This method utilizes a slurry with significant removal rates of Ta, somewhat lower removal rates of Cu, and somewhat lower removal rates of $SiO_2$. This method should be used when some Cu overburden remains, as was discussed in Method 3. Also, this method is effective in removal of some of the underlying $SiO_2$ dielectric layer, which helps to decrease the amount of dishing of the adjacent Cu structures, as well as improving the quality of the $SiO_2$ surface (by "touching-up" or "buffing" this surface). This allows for the removal of any Cu remaining on the wafer, complete and rapid removal of the Ta barrier layer, and some removal of the underlying $SiO_2$ layer to lower dishing and improve surface quality.

Method 5—This method utilizes a slurry with significant and similar removal rates of Ta, Cu, and $SiO_2$. Since this method can retain planarity due to equivalent removal rates, it can be used in any case when the surface produced after first step polishing is planar or nearly planar (i.e., when no Cu dishing or recess is observed). This method allows for the removal of any residual Cu overburden, the Ta barrier layer, and improvement of the underlying $SiO_2$ layer (as discussed in Method 4).

With the proper application of the above methods, patterned semiconductor wafers can be produced with low observed dishing or recess of the interconnect structures (in particular, Cu) as well as low erosion of the underlying dielectric layer (i.e., $SiO_2$). One important benefit of this method is that, by adjusting the second step slurry to compensate for any deficiencies generated in the first step of polishing, a more robust process capable of generating improved polishing results is developed. It has been determined that, through the addition of certain additives in specific amounts, the removal rates of Cu, Ta, and $SiO_2$ can be controlled in order to produce the removal rates described in the five methods discussed above.

In each method, a Ta removal rate above 1000 A/min is desired. Removal of Ta is enhanced at in alkaline pH ranges: therefore, all slurries discussed are in a pH range above 7. Silica is used as the mechanical portion of the slurries listed below: however, any metal oxide (e.g., alumina, titania, zirconia, etc.) or abrasive particles with suitably low particle size (<1 micron) would be appropriate for this application.

In the methods described above, the Cu removal rate ranges from under 250 A/min to over 1000 A/min. Benzotriazole, or BTA, is a well known passivating agent for Cu, and has been demonstrated to be effective in inhibiting Cu removal rates during CMP polishing (Steigerwald, 1995). By the addition of BTA is small amounts (between 0.0 and 0.06 wt. %), the Cu RR can be controlled within this range.

In the methods described above, the removal rate of $SiO_2$ varies from less than 100 A/min to over 1000 A/min, with most methods having lower removal rates. It is easy to achieve removal rates above 1000 A/min for $SiO_2$ films at alkaline conditions: commercially available products such as Rodel ILD 1200 (KOH based) and ILD 1300 ($NH_4OH$ based) easily produce removal rates above 1000 A/min for ILD films. The use of compounds containing quaternary ammonium cations enables the use of an alkaline slurry with lower $SiO_2$ removal rates. The use of quaternary ammonium compounds as oxide suppressants has been discussed in U.S. Pat. No. 5,614,444. However, it is found below that the effectiveness with respect to oxide suppression of the quaternary ammonium compound is enhanced when another quaternary ammonium compound, namely ammonium hydroxide, is present in the slurry. Removal rates for $SiO_2$ of <100 A/min were most easily achieved through the use of two quaternary ammonium compounds.

EXAMPLE 1

Polishing of 150 mm wafers containing Cu, Ta, and $SiO_2$ films was completed on a IPEC/WESTECH 372U polisher. An IC1000 K-groove/SUBA IV polishing pad was used. Polishing conditions were as follows: 5 psi wafer down pressure, 3 psi wafer back pressure, 120 ml/min slurry flowrate, 50 rpm platen speed, 60 rpm carrier speed. The Cu and Ta wafers were polished for 1 min, and the $SiO_2$ wafers were polished for 2 minutes. All slurries were aqueous based and contained 0.6% ammonium hydroxide and 11.3% fumed silica. All slurries were adjusted to a Ph of 10.8±0.1 with nitric acid. Various amounts of TMAN, TMAH, and BTA were added to the slurries. The removal rates (average removal for 3 wafers of each type) for each slurry is given in Table 3.

TABLE 3

| Sample | TMAH | TMAN | BTA | Cu RR | Ta RR | $SiO_2$ RR |
|---|---|---|---|---|---|---|
| 1 | 0.1 | 6.0 | 0.0 | 1979 | 1498 | 28 |
| 2 | 0.1 | 6.0 | 0.05 | 168 | 1319 | 24 |
| 3 | 0.1 | 4.0 | 0.05 | 151 | 1323 | 38 |
| 4 | 0.1 | 2.0 | 0.05 | 151 | 1530 | 142 |
| 5 | 0.55 | 2.0 | 0.05 | 161 | 1427 | 71 |
| 6 | 0.55 | 4.0 | 0.05 | 156 | 1580 | 41 |

Based on these results, it is clear that the addition of BTA to lower the slurry significantly lowers the removal rate of Cu. Also, the effect of the tetramethyl ammonium anion is also clearly illustrated: as the amount is increased, the removal rate of $SiO_2$ is attenuated.

EXAMPLE 2

Polishing of 150 mm wafers containing Cu, Ta, and $SiO_2$ films was completed on a IPEC/WESTECH 372U polisher. An IC1000 K-groove/SUBA IV polishing pad was used. Polishing conditions were as follows: 5 psi wafer down pressure, 3 psi wafer back pressure, 120 ml/min slurry flowrate, 50 rpm platen speed, 60 rpm carrier speed. The Cu and Ta wafers were polished for 1 min, and the $SiO_2$ wafers were polished for 2 minutes. All slurries were aqueous based and contained: 2.5% TMAH, 0.6% $NH_4OH$, and were adjusted to a pH of 10.8±0.1 with nitric acid. Various amounts of BTA and fumed silica were added to the samples as shown in Table 4. The removal rates (average removal for 3 wafers of each type) for each slurry is given below.

TABLE 4

| Sample | BTA | $SiO_2$ | Ta RR | Cu RR | $SiO_2$ RR |
|---|---|---|---|---|---|
| 7 | 0.0 | 8.5 | 1308 | 1231 | 5 |
| 8 | 0.025 | 5.0 | 1101 | 885 | 13 |
| 9 | 0.025 | 12.0 | 1428 | 410 | 8 |
| 10 | 0.05 | 8.5 | 1291 | 243 | 303 |

The results in Table 4 show the inverse effect of BTA on Cu removal rate. With no BTA in the slurry, the Cu removal rate is above 1000 A/min. Addition of 0.025% decreases the Cu removal rate to 400–800 A/min. Addition of 0.05% BTA further decreases the Cu removal rate to less than 250 A/min.

EXAMPLE 3

Polishing of 150 mm wafers containing Cu, Ta, and $SiO_2$ films was completed on a IPEC/WESTECH 372U polisher. An IC 1000 K-groove/SUBA IV polishing pad was used. Polishing conditions were as follows: 5 psi wafer down pressure, 3 psi wafer back pressure, 120 ml/min slurry flowrate, 50 rpm platen speed, 60 rpm carrier speed. The Cu and Ta wafers were polished for 1 min, and the $SiO_2$ wafers were polished for 2 minutes. All slurries were aqueous based and contained: 2.34% TMAH, 0.05% BTA, 11.3% fumed silica, and were adjusted to a pH of 10.8±0.1 with nitric acid. Sample 11 contained 0.6% ammonium hydroxide, and sample 12 contained no ammonium hydroxide. The removal rates (average removal for 3 wafers of each type) for each slurry is given below.

TABLE 5

| Sample | $NH_4OH$ | Ta RR | Cu RR | $SiO_2$ RR |
|---|---|---|---|---|
| 11 | 0.6 | 1286 | 226 | 28 |
| 12 | 0.00 | 1267 | 150 | 462 |

Based on these results, it is observed that the addition of ammonium hydroxide with TMAH further decreases the $SiO_2$ removal rate beyond the effect of TMAH alone.

EXAMPLE 4

Polishing of 150 mm wafers containing Cu, Ta, and $SiO_2$ films was completed on a IPEC/WESTECH 372U polisher. An IC1000 K-groove/SUBA IV polishing pad was used. Polishing conditions were as follows: 5 psi wafer down pressure, 3 psi wafer back pressure, 120 ml/min slurry flowrate, 50 rpm platen speed, 60 rpm carrier speed. The Cu and Ta wafers were polished for 1 min, and the $SiO_2$ wafers were polished for 2 minutes. All slurries were aqueous based and contained: 1.0% TMAH, 0.6% $NH_4OH$, 0.025% BTA, and were adjusted to a pH of 10.8±0.1 with nitric acid. Fumed silica in varying amounts was added to the samples as shown in Table 6. The removal rates (average removal for 3 wafers of each type) for each slurry is given below.

TABLE 6

| Sample | $SiO_2$ | Ta RR | Cu RR | $SiO_2$ RR |
|---|---|---|---|---|
| 13 | 5.0 | 1136 | 748 | 74 |
| 14 | 12.0 | 1482 | 587 | 71 |

The results in Table 6 illustrates that the effect of abrasive concentration is minimal, if any. While the removal rate of Ta does increase with increasing abrasive concentration, in the example above, the effect of increasing the abrasive concentration by 140% is an increase of Ta RR of only 30%. The Cu and $SiO_2$ RR are unaffected.

EXAMPLE 5

Polishing of 150 mm wafers containing Cu, Ta, and $SiO_2$ films was completed on a IPEC/WESTECH 372U polisher. An IC 1000 K-groove/SUBA IV polishing pad was used. Polishing conditions were as follows: 5 psi wafer down pressure, 3 psi wafer back pressure, 120 ml/min slurry flowrate, 50 rpm platen speed, 60 rpm carrier speed. The Cu and Ta wafers were polished for 1 min, and the $SiO_2$ wafers were polished for 2 minutes. All slurries were aqueous based and contained: 0.6% ammonium hydroxide, 0.05% BTA, and 11.3% fumed silica. Two different types of silica were used: Degussa Aerosil A-90 and Degussa Aerosil A-70. The nominal specific surface area of Aerosil A-90 is $90 m^2/g$, while the nominal specific surface area of Aerosil A-70 is 70

$m^2/g$. All slurries contained the same concentration of tetramethyl ammonium cation: however, the source in sample 15 and 16 was TMAH and TMAN, while the source in sample 17 is just TMAH. All slurries were adjusted to a pH of 10.8±0.1 with nitric acid. The removal rates (average removal for 3 wafers of each type) for each slurry is given below.

TABLE 7

| Sample | Silica | TMAH | TMAN | Cu RR | Ta RR | $SiO_2$ RR |
|---|---|---|---|---|---|---|
| 15 | A-90 | 1.0 | 2.0 | 1394 | 197 | 25 |
| 16 | A-70 | 1.0 | 2.0 | 1297 | 227 | 32 |
| 17 | A-90 | 2.34 | 0.0 | 1337 | 167 | 31 |

Based on these results, we observe that abrasives with different surface areas are equally effective in this application. Additionally, two different sources of the tetramethyl ammonium cation are used, and the same performance is observed. Therefore, the source of the tetramethyl ammonium cation is not critical.

EXAMPLE 6

Polishing of 150 mm wafers containing Cu, Ta, and $SiO_2$ films was completed on a IPEC/WESTECH 372U polisher. An IC1000 /SUBA IV polishing pad was used. Polishing conditions were as follows: 5 psi wafer down pressure, 2 psi wafer back pressure, 150 ml/min slurry flowrate, 80 rpm platen speed, 60 rpm carrier speed. The Cu and Ta wafers were polished for 1 min, and the $SiO_2$ wafers were polished for 2 minutes. All slurries were aqueous based and contained: 0.6% ammonium hydroxide, 0.06% benzotriazole (BTA), and 6% silica. All slurries were adjusted to a pH of 10.8±0.1 with various acids as listed in Table 8. Two different quaternary ammonium cation compounds were used: tetramethyl ammonium hydroxide (TMAH) and Cetyl-trimethyl ammonium bromide (CTAB). The removal rates (average removal for 3 wafers of each type) for each slurry is given below.

TABLE 8

| Sample | Acid | Ammonium compound | % Ammonium compound | Cu RR | Ta RR | $SiO_2$ RR |
|---|---|---|---|---|---|---|
| 18 | $HNO_3$ | CTAB | 0.5 | 300 | 1271 | 50 |
| 19 | $HNO_3$ | TMAH | 1.5 | 215 | 1480 | 70 |
| 20 | $H_2SO_4$ | TMAH | 1.5 | 282 | 1373 | 74 |
| 21 | $HO_2CCO_2H$ | TMAH | 1.5 | 266 | 1388 | 30 |

Based on these results, we observe that both inorganic and organic acids are effective when functioning as the acidic component of the slurry. Also, it is illustrated that various quaternary ammonium compounds are effective at inhibiting the $SiO_2$ removal rate.

EXAMPLE 7

Polishing of 150 mm wafers containing Cu, Ta, and $SiO_2$ films with various Cu slurries was completed on a IPEC/WESTECH 372U polisher. An IC 1000 K-groove/SUBA IV polishing pad was used. Four different slurries were used: FS-47, SS-73, SS-75, and SS-76. FS-47 is a slurry designed for use as a first step slurry, and SS-73, SS-75, and SS-76 are slurries designed for use as second step slurries. The formulation for FS-47 is as follows (on a weight % basis): 2% potassium iodate, 2% 5-sulfosalicylic acid, 0.2% poly-vinyl pyrollidone, 1% citric acid, 1.4% potassium hydroxide, 3% alumina, and the balance water. This slurry is at a nominal pH of 3.6. SS-73, SS-75, and SS-76 all contain the following: 6% silica, 1.5% TMAH, 0.6% $NH_4OH$, and are adjusted to a pH of 10.8 with nitric acid. Other additives to these three slurries are listed below:

TABLE 9

| Slurry | BTA |
|---|---|
| SS-73 | 0.06 |
| SS-75 | 0.03 |
| SS-76 | 0.00 |

Polishing conditions were as follows: 5 psi wafer down pressure, 3 psi 10 wafer back pressure, 150 ml/min slurry flowrate, 50 rpm platen speed, 60 rpm carrier speed. The removal rates (average removal for 3 wafers of each type) for each slurry is given below.

TABLE 10

| Slurry | Ta RR | Cu RR | $SiO_2$ RR |
|---|---|---|---|
| FS-47 | 43 | 4228 | 124 |
| SS-73 | 1480 | 215 | 20 |
| SS-75 | 1443 | 267 | 28 |
| SS-76 | 1582 | 1188 | 30 |

Patterned Cu wafers supplied by SEMATECH (Austin, Tex.) were polished on a IPEC/WESTECH 372U polisher. These patterned wafers contained Cu interconnect structures of various size and configuration, with a Ta barrier layer and $SiO_2$ as the dielectric. An IC 1000 K-XY groove/SUBA IV polishing pad with FS-47 was used in the first step: a Politex Regular pad with SS-76 was used in the second step. Conditions for the first step of polishing are given in the table below.

TABLE 11

| tep | Phase | DF (psi) | BP (psi) | PS (rpm) | CS (rpm) | Polish Time (sec) | Slurry Flowrate (ml/min) |
|---|---|---|---|---|---|---|---|
| 1 | 1 | 5 | 3 | 80 | 50 | 150 | 200 |
| 1 | 2 | 2 | 0 | 40 | 40 | 130 | 200 |

Cu dishing and oxide erosion numbers of the patterned wafers subjected to various second-step polishing conditions (defined in Table 12) are presented in the Table 13 below. Each number in Table 13 is the average of two readings.

TABLE 12

| Wafer | DF (psi) | BP (psi) | PS (rpm) | CS (rpm) | Polish Time (sec) | Slurry Flowrate (ml/min) |
|---|---|---|---|---|---|---|
| 1 | 2 | 0 | 80 | 80 | 45 | 200 |
| 2 | 5 | 3 | 80 | 80 | 30 | 200 |
| 3 | 5 | 0 | 80 | 80 | 30 | 200 |

TABLE 13

| Wafer | Dishing - Edge - 115 micron pad (A) | Dishing - 0.8 micron line (A) | Oxide Erosion (A) |
|---|---|---|---|
| 1 | 1105 | 460 | 37 |
| 2 | 503 | — | — |
| 3 | 118 | — | — |

The data above clearly shows that using the two-step polishing method outlined in this example that it is possible to obtain patterned cu wafers with very low dishing on large (>100 micron) and small (<1 micron) features, as well as generate very low oxide erosion.

What is claimed is:

1. A method for polishing a semiconductor substrate comprising:
    a) polishing copper at an initial copper removal rate and a barrier at an initial barrier removal rate, the initial copper removal rate being greater than the initial barrier removal rate, the barrier being selected from the group consisting of tantalum, tantalum nitride, titanium, titanium nitride and combinations thereof;
    b) suppressing a dielectric with ammonium hydroxide and a quaternary ammonium salt selected from the group consisting of tetramethyl ammonium hydroxide, cetyl-trimethyl ammonium hydroxide, cetyl-trimethyl ammonium bromide contained in a polishing composition; and
    c) polishing remaining copper with the polishing composition at a subsequent copper removal rate, the dielectric at a dielectric removal rate and the barrier at a subsequent barrier removal rate, the subsequent barrier removal rate being greater than the dielectric removal rate and the subsequent copper removal rate, the polishing composition including the ammonia hydroxide and the quaternary ammonium salt selected from the group consisting of tetramethyl ammonium hydroxide, cetyl-trimethyl ammonium hydroxide, cetyl-trimethyl ammonium bromide and combinations thereof to suppress the dielectric removal rate.

2. The method of claim 1 wherein the polishing composition has a pH greater than 7 for the polishing of step b).

3. The method of claim 1 wherein the polishing of step b) occurs with the dielectric being a low-k dielectric material.

* * * * *